(12) United States Patent
Laufer et al.

(10) Patent No.: US 7,428,037 B2
(45) Date of Patent: Sep. 23, 2008

(54) OPTICAL COMPONENT THAT INCLUDES A MATERIAL HAVING A THERMAL LONGITUDINAL EXPANSION WITH A ZERO CROSSING

(75) Inventors: Timo Laufer, Aalen (DE); Jean-Noel Fehr, Pully (CH); Harald Kirchner, Munich (DE); Andreas Ochse, Oberkochen (DE)

(73) Assignee: Carl Zeiss SMT AG, Oberkochen (DE)

( * ) Notice: Subject to any disclaimer, the term of this patent is extended or adjusted under 35 U.S.C. 154(b) by 459 days.

(21) Appl. No.: 11/042,779

(22) Filed: Jan. 24, 2005

(65) Prior Publication Data

US 2005/0207001 A1   Sep. 22, 2005

Related U.S. Application Data

(63) Continuation-in-part of application No. PCT/EP03/07038, filed on Jul. 2, 2003.

(30) Foreign Application Priority Data

Jul. 24, 2002   (DE)   ................................. 102 33 828

(51) Int. Cl.
*G03B 27/42* (2006.01)
*G03B 27/52* (2006.01)
*G03B 27/54* (2006.01)

(52) U.S. Cl. ............................. 355/30; 355/53; 355/67; 355/71; 378/34; 378/35

(58) Field of Classification Search .................. 355/30, 355/67, 71, 53; 359/350, 351, 359, 360, 359/838; 378/34, 35
See application file for complete search history.

(56) References Cited

U.S. PATENT DOCUMENTS 2,326,056 A   8/1943   Nadeau et al.

(Continued)

FOREIGN PATENT DOCUMENTS

| EP | 0955565 | 11/1999 |
| EP | A 1123195 | 8/2001 |
| WO | WO2004089838 | * 10/2004 |

OTHER PUBLICATIONS

Dinger, U. et al., "Mirror Substrates for EUV-Lithography: Progress In Metrology and Optical Fabrication Technology," Proceedings of the SPIE, SPIE, Bellingham, VA, US, vol. 4146, pp. 35-46, Aug. 2000.

(Continued)

*Primary Examiner*—Della J. Rutledge
(74) *Attorney, Agent, or Firm*—Ohlandt, Greeley, Ruggiero & Perle L.L.P.

(57) ABSTRACT

There is provided an optical component. The optical component includes a material having a surface that heats to a maximum temperature ($T_{max}$) when subjected to radiation. The material has a temperature-dependent coefficient of thermal expansion ($\alpha(T)$) of about zero at a temperature $T_0$ that is approximately equal to $T_{max}$. The optical component is suitable for use in any of an illumination system, a projection objective or a projection exposure system, as employed, for example, for EUV microlithography.

28 Claims, 7 Drawing Sheets

U.S. PATENT DOCUMENTS

| | | | |
|---|---|---|---|
| 2,326,059 A | 8/1943 | Nordberg | |
| 4,422,725 A | 12/1983 | Prewo | |
| 5,265,143 A * | 11/1993 | Early et al. | 378/84 |
| 5,322,559 A | 6/1994 | Sleight | |
| 6,228,512 B1 * | 5/2001 | Bajt et al. | 428/635 |
| 6,353,470 B1 | 3/2002 | Dinger | |
| 6,747,730 B2 * | 6/2004 | Box | 355/53 |
| 2004/0165173 A1 * | 8/2004 | Box | 355/77 |

OTHER PUBLICATIONS

"Optics Guide 3," Optics Guide, Melles Griot, Irvinge, CA, US, pp. 68 and 177, 1985.

Schultz, P.C., et al., "Ultra low expansion glasses and their structure in the $SiO_2$-$TiO_2$-System," Amorphous Materials, pp. 453-461, Sep. 1970.

* cited by examiner

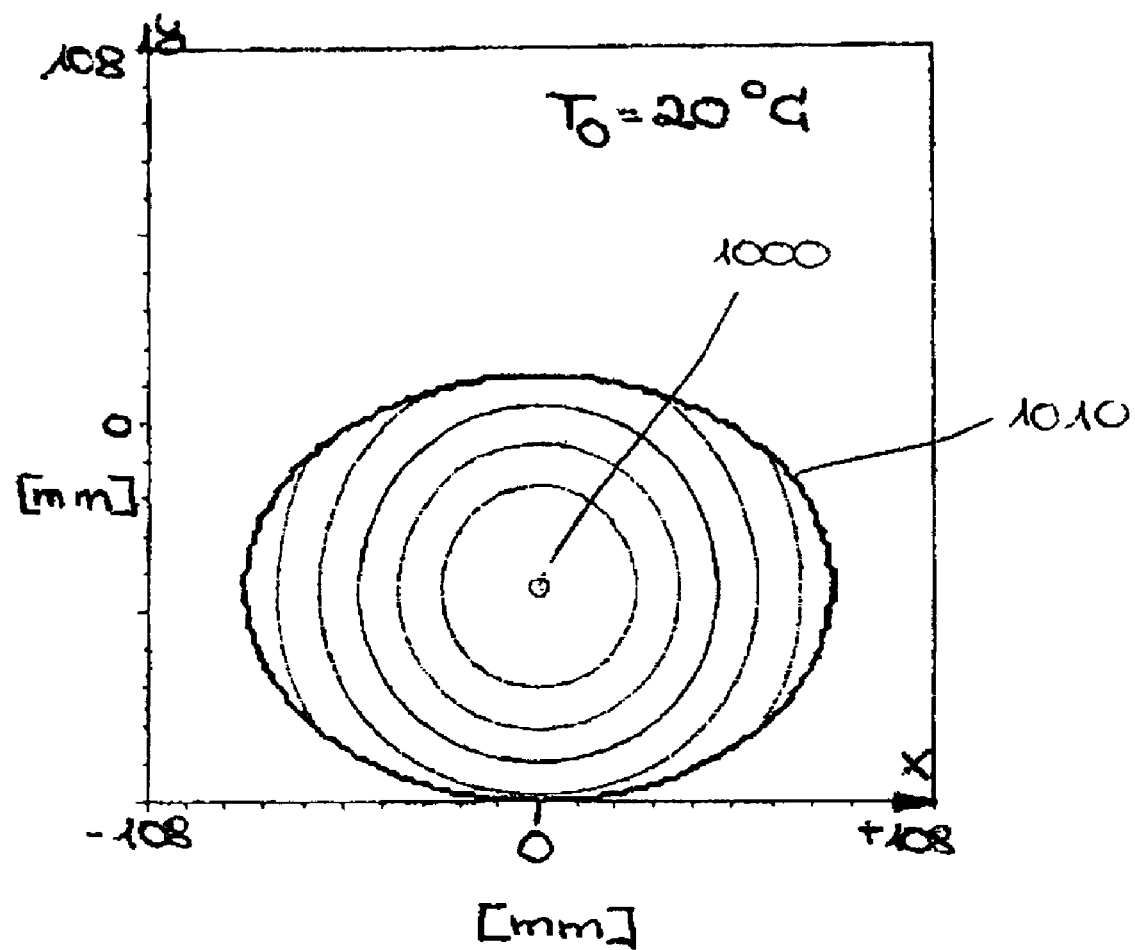

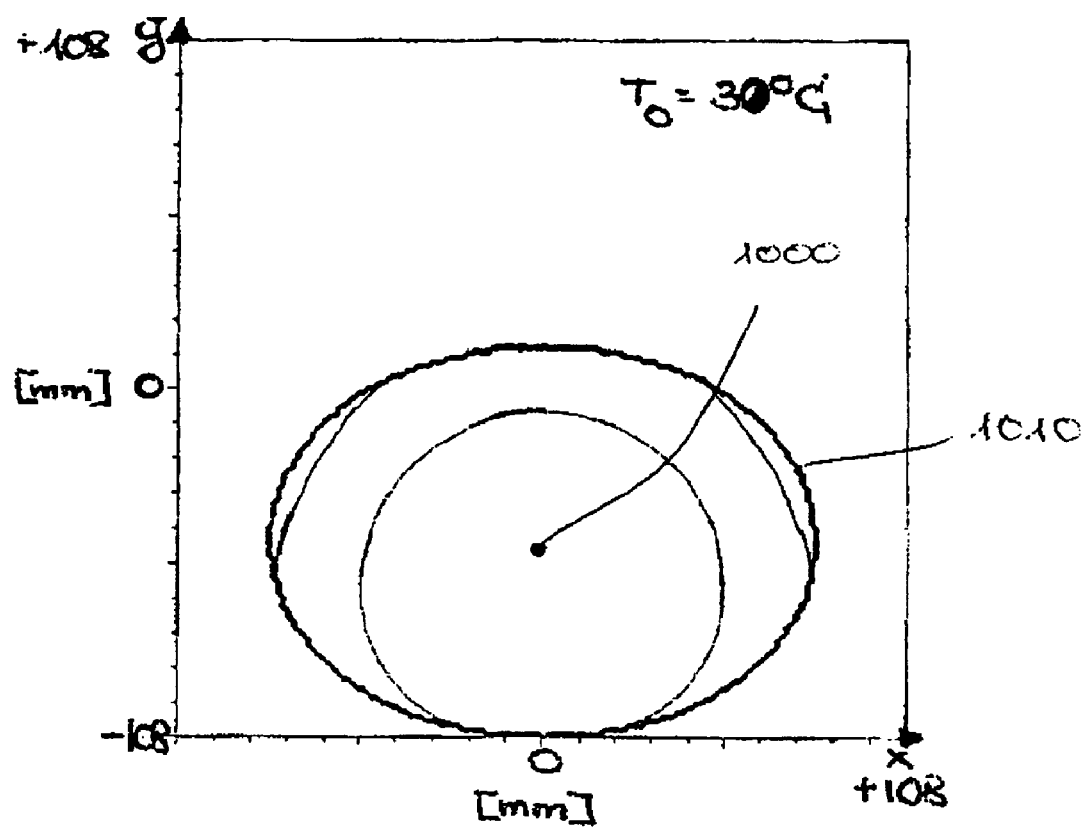

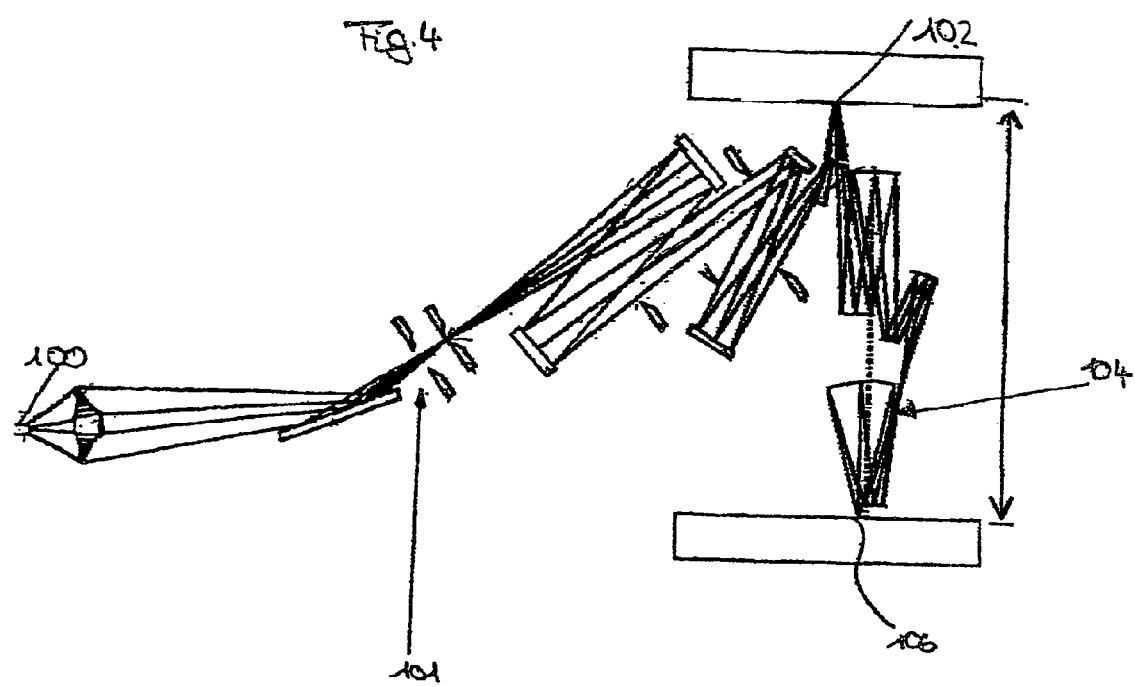

OPTICAL COMPONENT THAT INCLUDES A MATERIAL HAVING A THERMAL LONGITUDINAL EXPANSION WITH A ZERO CROSSING

CROSS-REFERENCE TO RELATED APPLICATIONS

The present application is a continuation-in-part of International Application No. PCT/EP03/07038, filed Jul. 2, 2003, which claims priority of German Application No. 102 33 828.0, filed Jul. 24, 2002.

BACKGROUND OF THE INVENTION

1. Field of the Invention

The present disclosure is directed toward an optical component such as, for example, a mirror in a projection objective. Electromagnetic radiation emitted by a light source impinges on an optical surface of the optical component, and consequently, heats the optical component to a maximum temperature $T_{max}$. The optical component is fabricated of a material having a temperature-dependent coefficient of thermal expansion $\alpha(T)$.

Such optical components are of particular interest especially in the field of X-ray lithography. This applies in particular for lithography with soft X-rays, namely the so-called extreme ultraviolet (EUV) lithography in the wavelength region of 10 to 30 nanometers (nm). Mirrors with a high reflectivity in the X-ray region are used as optical components in the area of X-ray lithography. Such mirrors can be operated close to the perpendicular incidence as so-called normal-incidence mirrors or in grazing incidence as grazing-incidence mirrors. Mirrors are designated as grazing-incidence mirrors where rays of a ray pencil impinge upon the mirrors at angles of $\alpha > 70°$ relative to the surface normal.

2. Description of the Related Art

X-ray mirrors with a high reflectivity in the X-ray region that are operated as normal-incidence mirrors comprise a substrate material and, based on the same, a multi-layer system, e.g. a Mo/Si multi-layer system or a Mo/Be multi-layer system or a MoRu/Be multi-layer system. With such systems it is possible to achieve reflectivity of over 50% or even of over 60% in the EUV range.

Depending on a wavelength of light to be reflected, it is also possible to use layer systems of other materials.

In addition to X-ray mirrors that are operated as normal-incidence mirrors it is also possible to use mirrors that are operated in grazing incidence, namely so-called grazing-incidence mirrors. Such mirrors also comprise a substrate material. A simpler layer system is applied to the substrate material however. The applied layer can be a ruthenium, palladium or rhodium layer.

For X-ray mirrors used in EUV lithography, and especially in projection objectives, high image-forming qualities are should be achieved.

Since the X-radiation, as explained above, is never reflected completely either under normal incidence or under grazing incidence, energy is introduced into the mirrors, and the mirrors or the respective optical components heat up, that is, increase in temperature. The heating of an optical component causes a thermal expansion that influences image-forming quality of the optical component.

EP 0 955 565 discusses minimization of thermal effects in optical components used in EUV projection systems. For the purpose of suppressing the thermal effects, the mirrors known from EP 0 955 565 comprise a metallic substrate as substrate material. As a result of the favorable thermal conductivity of the metals, the heat introduced into the mirrors is removed efficiently via the rear sides of the metal substrates preferably by a cooling apparatus. The aberrations due to mirror deformations are minimized by this discharge of heat.

A disadvantageous aspect in the solution according to EP 0 955 565 is that the minimization of aberrations introduced by the heat occurs in such away that the heat introduced into the optical component is removed actively by the cooling device. This requires a complex set-up. Moreover, additional components always bear a risk for failure.

A further disadvantage in the use of metals as substrate material is that it is necessary, in order to achieve the smoothest possible surface, to coat the metal substrate with a thin film of an amorphous substance as an intermediate layer. The intermediate layer is polished in order to achieve a sufficiently low roughness. It is only on this layer that the optical layers of the EUV components are applied, e.g., the multiple layer systems for the normal-incidence mirrors or the optical coatings for the grazing-incidence mirrors.

SUMMARY OF THE INVENTION

It is an object of the present invention to overcome the disadvantages of the state of the art, especially to provide a possibility with which aberrations caused by the heating of the respective optical component are minimized. This goal is to be achieved with the lowest possible technical input.

This object is achieved by an optical component that includes a material having a temperature-dependent coefficient of thermal expansion $\alpha(T)$, such that $\alpha(T)$, or its derivative with respect to temperature, i.e., $d\alpha(T)/dT$, changes sign from positive to negative or from negative to positive close to a temperature $T_0$ that corresponds approximately to the maximum temperature $T_{max}$ to which the optical component, i.e. the optical surface of the optical component, is heated by impinging radiation. The expression "corresponds approximately to the maximum temperature" shall mean in the present application that the following applies:

$$T_{max} - 0.5 \cdot \delta T \leq T_0 \leq T_{max} + 0.5 \cdot \delta T$$

preferably $$T_{max} - 0.3 \cdot \delta T \leq T_0 \leq T_{max} + 0.3 \cdot \delta T$$

and more preferably $$T_{max} - 0.15 \delta T \leq T_0 \leq T_{max} + 0.15 \delta T,$$

That is, the temperature $T_0$ lies within 0.5 $\delta T$ above and 0.5 $\delta T$ below $T_{max}$.

$\delta T$ denotes a temperature variation on the surface. Normally the optical component is heated in operation to different temperatures dependent from the location on the surface. For example if one looks at the surface of a mirror as an optical component normally the center of the mirror is heated to a higher temperature than the margin of the mirror. If for example the temperature on the surface in the center is the maximum temperature $T_{max} = 30°$ C. and the temperature at the margin of the mirror under operation is the minimum temperature $T_{min} = 27°$ C. than from this example one can derive $\delta T = (30° \text{ C.} - 27° \text{ C.}) = 3°$ C. for such a mirror. $\delta T = 3°$ C. correspond to a $\delta T = 3K$, where K is temperature in Kelvin. Thus, $\delta T$ can be calculated for all optical components if one knows the maximum and the minimum temperature that occurs on the surface when radiation impinges thereon.

If as shown above the maximum temperature on the mirror surface corresponds to 30° C. in the center of the mirror surface, and the minimum temperature corresponds to 24° C. e.g. at the margin of the mirror, then in a preferred embodiment the following applies for the expression "corresponds approximately to the maximum temperature":

$$T_{max}-3K \leq T_0 \leq T_{max}+3K,$$

preferably:

$$T_{max}-2K \leq T_0 \leq T_{max}+2K$$

and most preferably:

$$T_{max}-1K \leq T_0 \leq T_{max}+1K$$

If the material of the mirror, and in particular the substrate material, is chosen as described above, then it is no longer necessary to provide complex cooling as in the state of the art (e.g. EP 0 955 565) in order to keep aberrations at a low level as a result of the heating of the optical component by the introduced energy.

A material (and in particular a substrate material) is preferably used with an approximately linear temperature dependence $\alpha(T)=m \cdot (T-T_0)$ of the temperature-dependent coefficient of thermal expansion in a temperature range close to the temperature $T_0$. Here m designates the gradient of the temperature-dependent coefficient of thermal expansion.

Substrate materials with such a temperature-dependent coefficient of thermal expansion are for example glass ceramic materials or Ti-doped quartz glasses. Glass ceramic materials or Ti-doped quartz glass as substrate material have the advantage that layer systems without an amorphous intermediate layer can be applied on this substrate material in contrast to metallic substrate materials. A further advantage of such substrate materials is the low thermal expansion.

The temperature-dependent coefficient of thermal expansion depending on the temperature and the possibility to influence the same by changing the material properties is described for Ti-doped quartz glass in "Ultra low expansion glasses and their structure in the $SiO_2$—$TiO_2$-System" of P. C. Schultz, H. T. Smyth, Amorphous Materials, September 1970, pages 453-461 and U.S. Pat. No. 2,326,056. The scope of disclosure of these publications is fully included in the scope of disclosure of the present application.

As is known from these publications, the temperature-dependent coefficient of thermal expansion $\alpha(T)$ changes its sign when the temperatures for such materials increases between approximately 20° C. to 70° C., which is of interest for EUV lithography.

This behavior differs in other temperature intervals. In some intervals, even the gradient can change sign.

"Ultra low expansion glasses and their structure in the $SiO_2$—$TiO_2$-System" of P. C. Schultz, H. T. Smyth, Amorphous Materials, September 1970, pages 453-461 defines the temperature-dependent coefficient of thermal expansion as the change in the longitudinal expansion of a body $\Delta L$ relative to a reference length L at a temperature T, with the temperature T=25° C. The dependence $\alpha(T)=\partial \Delta L/\partial L$ thus applies.

The temperature-dependent coefficient of thermal expansion thus has, at a temperature $T_0$, a value $\alpha(T_0)=0$, a so-called zero-expansion point or a zero crossing point. The temperature $T_0$ of the zero-crossing point is dependent upon the $TiO_2$ content.

The temperature-dependent coefficient of thermal expansion $\alpha(T)$ of glass ceramic materials shows for certain compositions a change of sign from positive to negative for increasing temperatures in the temperature range of 20° C. to 70° C., which means that this material also shows at a temperature $T_0$, a value $\alpha(T_0)=0$. This point is known as the so-called zero-expansion point or zero crossing point.

This behavior is the result of the fact that the glass ceramic materials comprise microcrystallites with negative thermal expansion which are embedded in an amorphous material with positive thermal expansion. The negative thermal expansion of the crystallites offsets the positive thermal expansion of the glass at the temperature $T_0$ at the zero-crossing point and vice-versa.

As a result of the roughness values of the glass ceramic materials or the $TiO_2$-doped glass, a layer system can be structured directly on the surface of such a glass or such a glass ceramic material, which system comprises a plurality of layers which form a multiple-layer system for a normal-incidence mirror. It is similarly possible to apply a coating for a grazing-incidence EUV mirror on a glass ceramic material or a glass as a substrate material. An intermediate layer which is applied between the substrate material and the coating as described in EP 0955565 for achieving the optical surface quality is not necessary.

In addition to the optical component, the invention also provides an illumination system and a projection objective and a projection exposure system that includes at least one such optical component.

BRIEF DESCRIPTION OF THE DRAWINGS

The invention is now explained in closer detail by reference to the figures, wherein:

FIGS. 2a and 2b show a deformation of a mirror surface of a mirror substrate for the first mirror of the microlithography projection objective with six mirrors according to FIG. 3, with a maximum temperature $T_{max}=30°$ C., with $T_o=20°$ C. (FIG. 2a) and $T_o=30°$ C. (FIG. 2b) having been chosen for the substrate material;

(FIG. 2c) and $T_o=27°$ C. (FIG. 2b) having been chosen for the substrate material;

FIG. 4 shows an EUV projection exposure system with a light source, an illumination system and a projection objective.

DESCRIPTION OF THE INVENTION

A temperature-dependent coefficient of thermal expansion of a substrate material is a temperature-dependent function $\alpha(T)$.

Figure 1A:
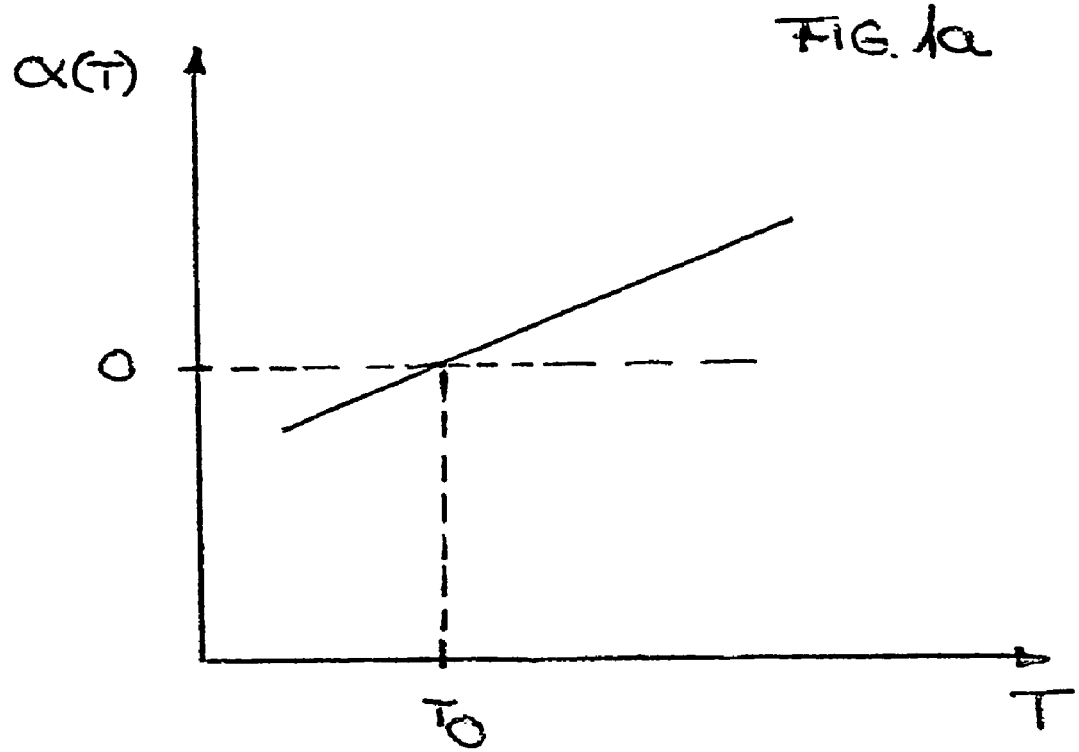
FIG. 1a is a graph of coefficient of thermal expansion $\alpha(T)$ as a function of temperature (T) for a $TiO_2$-doped glass in a temperature range of approx. 20° C. to 70° C., which is of interest for EUV lithography.
Figure 1B:
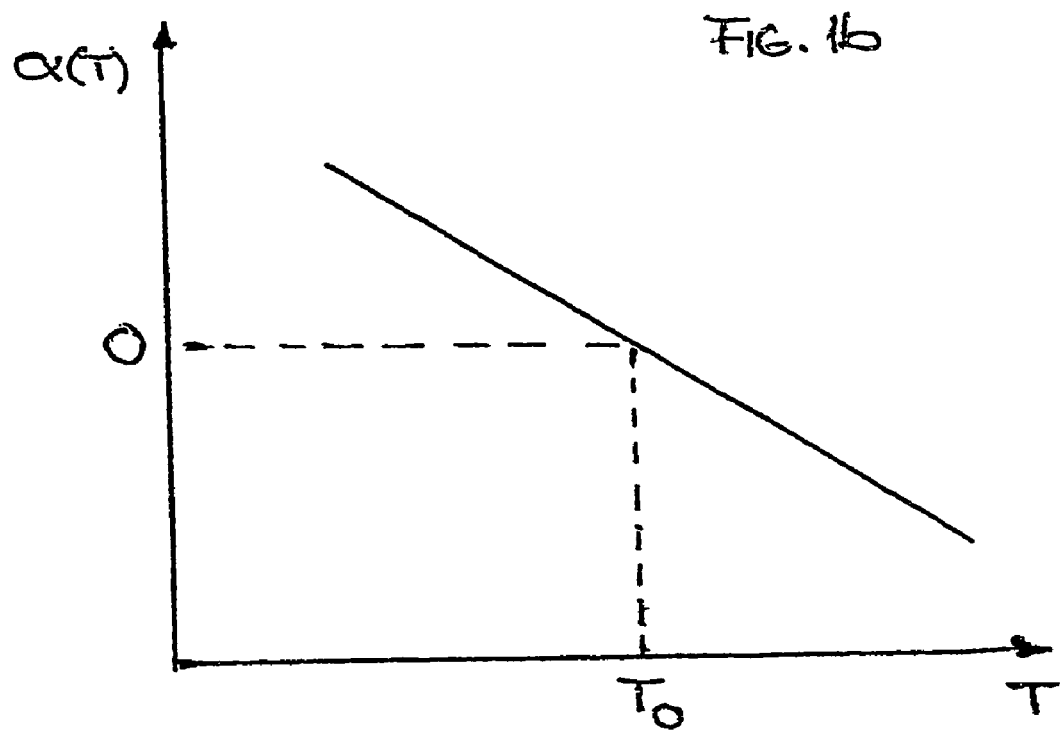
FIG. 1b is a graph of coefficient of thermal expansion $\alpha(T)$ as a function of temperature (T) for a glass ceramic material in a temperature range of 20° C. to 70° C.
Figure 1C:
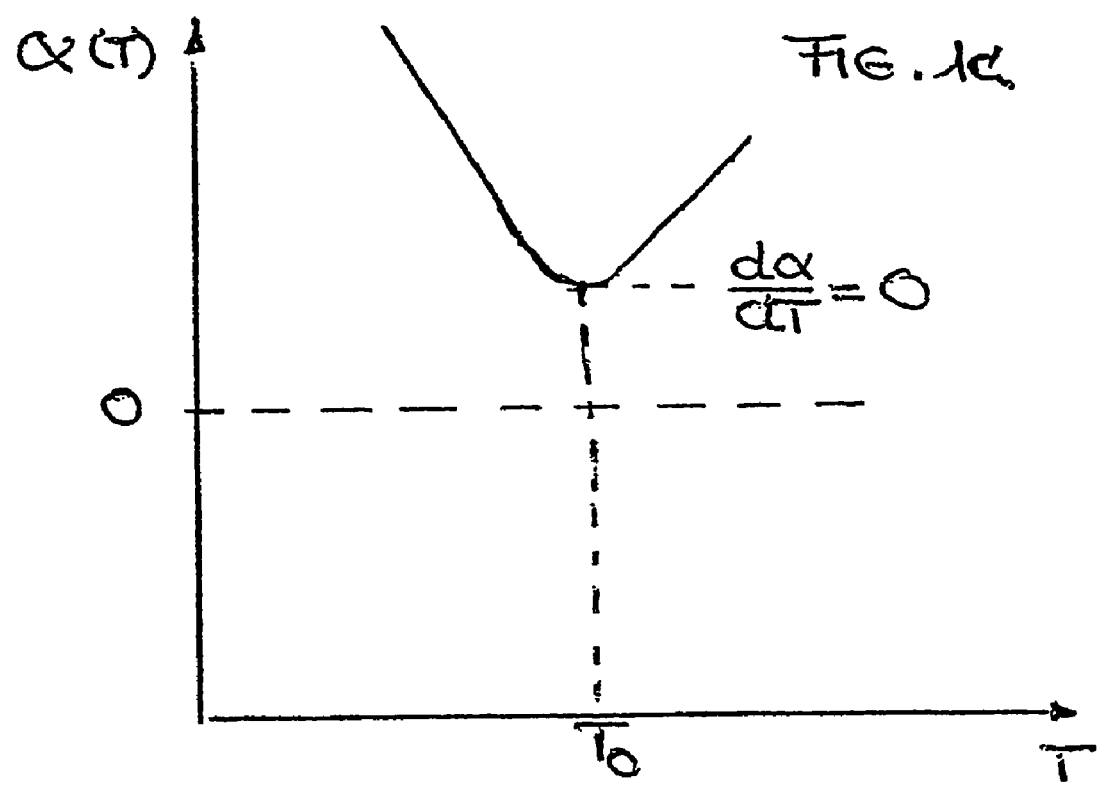
FIG. 1c is a graph of coefficient of thermal expansion $\alpha(T)$ as a function of temperature (T) for a material in which a derivative of the function $\alpha(T)$, i.e., $d\alpha(T)/dT$, changes sign in a temperature range of 20° C. to 70° C.

There are several possibilities for the function of $\alpha(T)$ for materials that are used in optical components They are shown in FIGS. 1a to 1c.

FIG. 1a is a graph of coefficient of thermal expansion $\alpha(T)$ as a function of temperature (T) for a $TiO_2$-doped glass in a temperature range of approx. 20° C. to 70° C., which is of interest for EUV lithography. With a rising temperature, the temperature-dependent coefficient of thermal expansion takes on a value of zero at some point, and so, its sign changes from negative to positive. The temperature-dependent coefficient of thermal expansion thus has a zero-crossing at a temperature $T_0$. If the temperature T is higher than $T_0$, then the temperature-dependent coefficient of thermal expansion is positive, that is, as temperature increases, the material expands. For temperatures T lower than $T_0$ the temperature-dependent coefficient of thermal expansion is negative, that is, as temperature increases, the material contracts. In the region of the zero crossing at a temperature $T_0$, the temperature-dependent function of the coefficient of thermal expansion can be described by the linear relationship $\alpha(T) = m \cdot (T-T_0)$, where m is a gradient. The gradient m lies in the region of $1.5 \ast 10^{-9} K^{-2} \leq m \leq 1 \ast 10^{-7} K^{-2}$, depending on the composition of the glass, where K is temperature in Kelvin. The decisive aspect is not the absolute value of the increase of the coefficient of thermal expansion, but the zero crossing of the coefficient of thermal expansion at a temperature $T_0$ and the adjustability of $T_0$ in a temperature range $\Delta T$, for example $\Delta T = 50$ K by the material composition. Preferably, the material composition has a low increase of $m = 1.5 \ast 10^{-9} K^{-2}$, for example.

FIG. 1b is a graph of coefficient of thermal expansion $\alpha(T)$ as a function of temperature (T) for a glass ceramic material in a temperature range of 20° C. to 70° C. The glass ceramic material is characterized by a reverse curve for $\alpha(T)$. Zerodur®, which is a trademark of Schott-Glas, Mainz, Germany, is an example of such a material. For Zerodur® the curve can be approximated by $\alpha(T) = m \cdot (T-T_0)$ in the region of the zero crossing. The gradient m for the material Zerodur® is negative and lies in the region of $-0.5 \ast 10^{-9} K^{-2} \leq m \leq -1.0 \ast 10^{-8} K^{-2}$. Preferably, the material has a low gradient m of $-1.5 \ast 10^{-9} K^{-2}$ for example. For temperatures higher than $T_0$ the temperature-dependent coefficient of thermal expansion is negative in the temperature range of 20° C. to 70° C., that is, given an increase in temperature, the material contracts. For temperatures T lower than $T_0$ the temperature-dependent coefficient of thermal expansion is positive, that is, given an increase in temperature, the material expands. By suitable selection of the material composition of the glass ceramic material it is possible to displace the zero-crossing point in a temperature range of $\Delta T$ for example to $\Delta T = 50$ K.

$T_0$ can therefore be set according to requirements. An optical component will have a minimal aberration when the zero-crossing point of the temperature-dependent coefficient of thermal expansion $\alpha(T)=0$ is chosen in such a way that $T_0$ corresponds approximately to the maximum temperature $T_{max}$ of the optical surface of the respective optical component. It is understood under "approximately the maximum temperature $T_{max}$ of the optical component" that $T_0$ lies in the region of $$T_{max} - 0.5 \cdot \delta T \leq T_0 \leq T_{max} + 0.5 \cdot \delta T$$

preferably $$T_{max} - 0.3 \cdot \delta T \leq T_0 \leq T_{max} + 0.3 \delta T$$

most preferably $$T_{max} - 0.15 \cdot \delta T \leq T_0 \leq T_{max} + 0.15 \delta T$$

wherein $T_{max}$ denotes the maximum temperature that occurs under operation conditions on the optical surface of the respective optical component, and $\delta T$ denotes the temperature range within which the temperatures on the surface vary, i.e., a temperature difference between locations on the surface.

$\delta T$ is given by the difference between the maximum temperature $T_{max}$ and the minimal temperature $T_{min}$ to which the optical component is heated under operating conditions, i.e., $$\delta T = (T_{max} - T_{min}).$$

In a most preferred embodiment the following applies:

$$T_{max} - 3K \leq T_0 \leq T_{max} + 3K,$$

especially of $$T_{max} - 2K \leq T_0 \leq T_{max} + 2K,$$

especially preferably of $$T_{max} - 1K \leq T_0 \leq T_{max} + 1K.$$

The zero crossing in the materials shown in FIGS. 1a and 1b lies at temperature $T_0$ where the temperature-dependent coefficient of thermal expansion changes sign from positive to negative with rising temperature or vice-versa from negative to positive. The maximum temperature $T_{max}$ of the respective optical component which is preferably a substrate material for a mirror is the temperature to which the optical component (i.e. the optical surface of the optical component onto which the radiation impinges) heats up as a result of the absorbed heat radiation. The heating can be caused for example by EUV radiation which impinges upon the optical component and which is emitted by a light source or can be caused by actuators or sensors arranged on the substrate material. As a result of this heat radiation, the optical component heats up to a temperature $T_{max}$. The optimal temperature $T_0$ of the zero crossing of the temperature-dependent coefficient of thermal expansion $\alpha(T)$ at which the lowest aberrations occur when using the substrate material for the mirrors is when $T_0$ equals $T_{max}$. In a mirror, the maximum temperature $T_{max}$ usually occurs in the middle of the mirror of the relevant mirror surface.

Other places of the relevant mirror surface are also heated up by the impinging radiation but due to a better heat dissipation at the edge of the mirror surface the temperatures are lower than the maximum temperature $T_{max}$ that occurs in the center of the mirror surface. The lowest temperatures $T_{min}$ to which the surface of the optical component is heated normally occurs at the edge of the optical component. As explained above, the temperature variation, $\delta T$, on the surface when the optical component is heated is then:

$$\delta T = T_{max} - T_{min}.$$

Figure 2C:
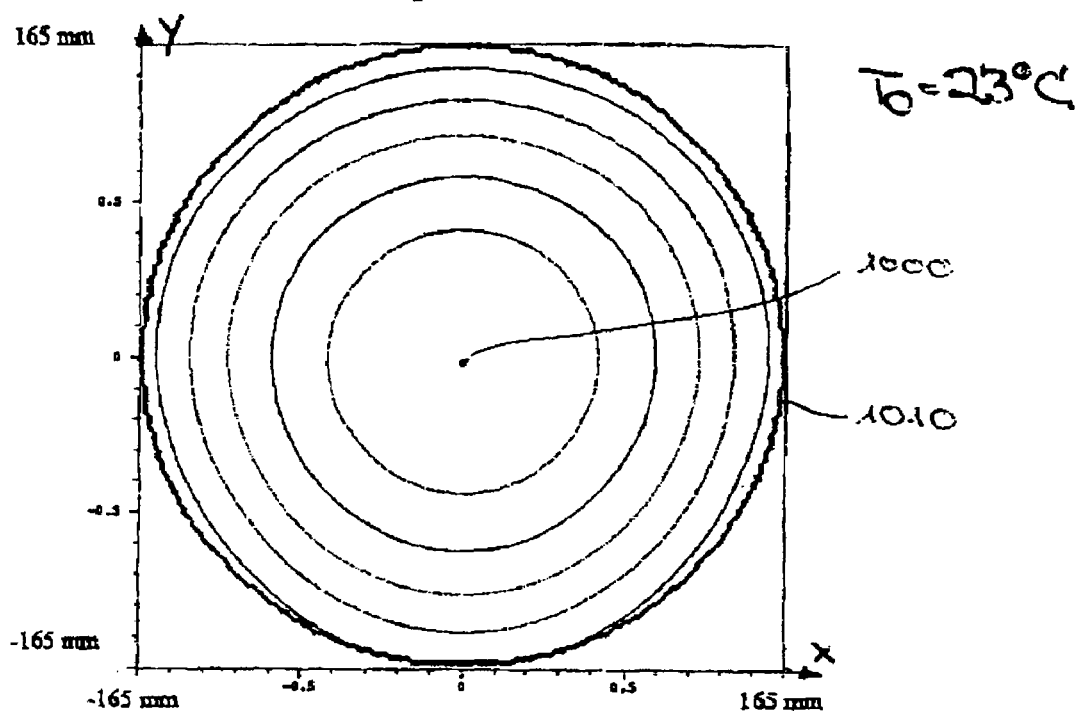
FIGS. 2c and 2d show a deformation of a mirror surface of a mirror substrate for the second mirror of the microlithography projection objective with six mirrors according to FIG. 3, with a maximum temperature $T_{max}=27.5°$ C., with $T_o=23°$ C.
Figure 3:
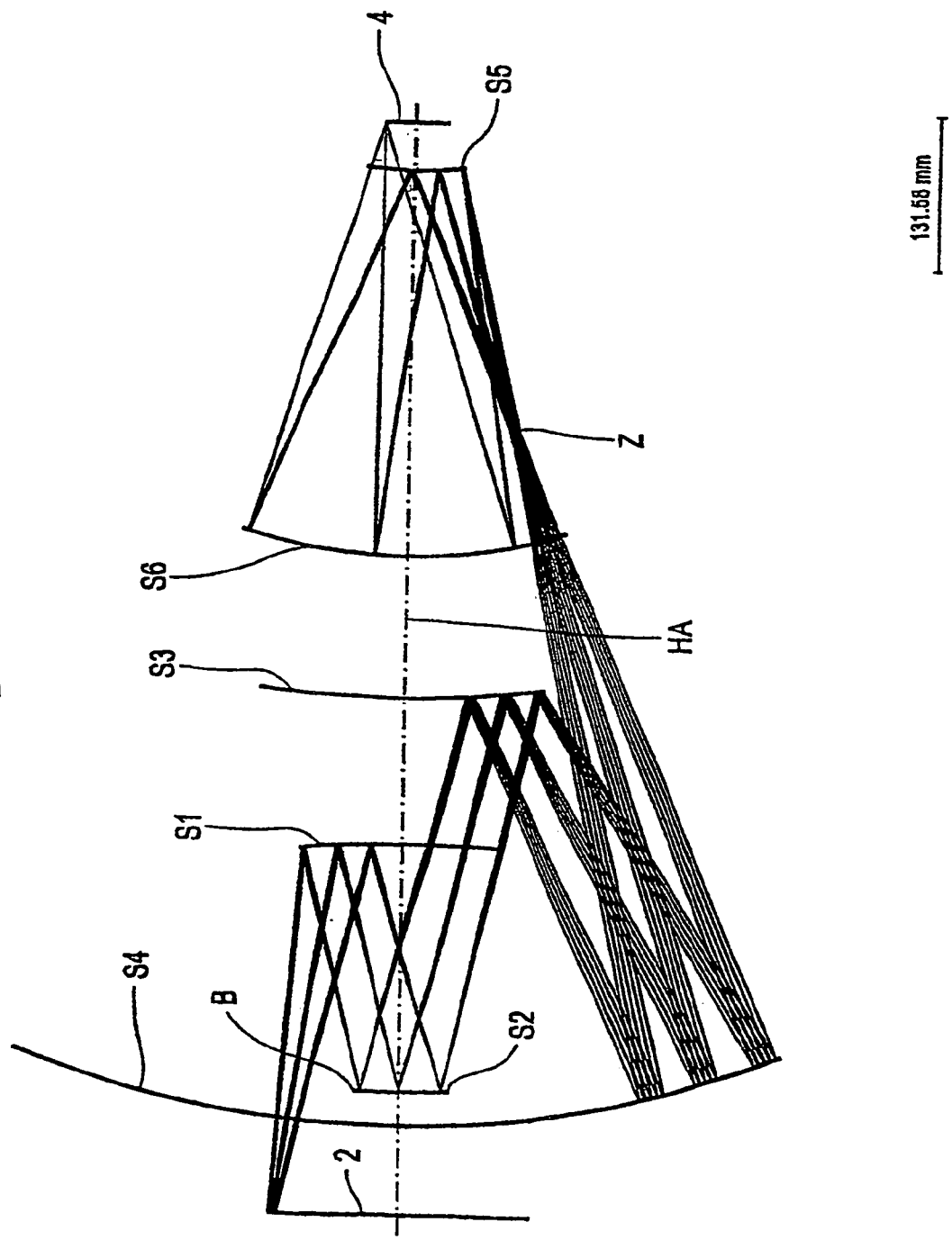
FIG. 3 shows a projection objective with six mirrors.

In a case of the mirror being used in a projection objective, the relevant mirror surface is the surface on which image-forming rays impinge in the projection objective and are partly reflected, and which pass through the projection objective from an object plane to an image plane, as shown in FIG. 3 and described below. If a ring field illuminated in the object plane, for example, is projected into a reduced ring field in the image plane (as described in U.S. Pat. No. 6,353,470), the relevant mirror surface (which is also called used area) is ellipsoid for the first mirror, as shown in FIG. 2a.

FIG. 1c is a graph of coefficient of thermal expansion $\alpha(T)$ that attains a minimum value at a temperature $T_0$ in a temperature range of 20° C. to 70° C. Minimum aberrations are also found in optical components fabricated of a material having a temperature-dependent coefficient of thermal expansion that attains a minimum, as shown in FIG. 1c, rather than having a zero crossing, as shown in FIGS. 1a and 1b. In such a material, the derivative of the coefficient of thermal expansion with respect to the temperature, i.e., $d\alpha(T)/dT$, shows a zero crossing or change of sign at temperature $T_0$. If $T_0$ is chosen so that the zero crossing of the derivative $d\alpha(T)/dT$ lies at maximum temperature $T_{max}$, minimum aberrations are obtained when such a material is used as a substrate for a mirror.

Special embodiments will be outlined below.

FIG. 2a shows the deformation of a substrate surface for a material with a zero crossing $T_0=20°$ C. of the temperature-dependent coefficient of thermal expansion: $\alpha(T)$, and FIG. 2b shows the deformation of a substrate surface in the region of the relevant mirror surface in which the zero crossing of the temperature-dependent coefficient of thermal expansion $\alpha(T)$ of the substrate material was chosen at $T_0=30°$ C. The maximum temperature $T_{max}$ occurs in the middle or the center 1000 of the relevant mirror surface. At the edge 1010 of the relevant mirror surface, the minimum temperature $T_{min}$ to which the relevant mirror surface is heated up occurs. The maximum temperature $T_{Max}$ to which the substrate surface is heated in the region of the relevant mirror surface as a result of absorbed thermal radiation (e.g., the first mirror of a projection object as shown in U.S. Pat. No. 6,353,470) is 30° C.

The variation in the deformation occurring in the mirrors is shown in the FIGS. 2a and 2b by contour lines. The variation is the peak-to-valley (PV) value at the mirror surface. The PV value is the difference between maximum deformation and minimum deformation. The PV value as a result of thermal expansion under thermal load is 1.7 nm for the embodiment according to FIG. 2a and 0.16 nm according to FIG. 2b. As can be seen from FIGS. 2a and 2b, the deformation is greater for the mirror with the substrate material $T_0=20°$ C., i.e., FIG. 2a, than for the mirror with the substrate material $T_0=30°$ C., i.e., FIG. 2b.

The peak-to-valley (PV) value for the material whose zero crossing of the temperature-dependent coefficient of thermal expansion corresponds to the maximum temperature $T_0=T_{max}$ is thus significantly lower than in the material where $T_0$ is far lower than $T_{max}$, e.g. a temperature of $T_0<T_{max}-10K$. The aberrations as a result of such deformations caused by such heating can be reduced considerably by suitable selection of the substrate material for example with a zero crossing of the temperature-dependent coefficient of thermal expansion at the maximum mirror temperature. In the embodiment according to FIG. 2a and 2b they are reduced by a factor of 10 for example. The embodiment according to FIGS. 2a and 2b is based on Ti-doped quartz glass as substrate material, with $\alpha(T)=1.5$ ppb/$K^2 \cdot (T-T_0)$. In the embodiment according to FIGS. 2a and 2b, 0.8 W is assumed as the application of energy which leads to the heating of the substrate surface. If one assumes an even application of energy into the optical surface of the mirror substrate, then the mirror substrate heats up to the aforementioned maximum temperature of $T_{max}=30°$ C. The maximum temperature $T_{max}=30°$ C. occurs in the middle of the mirror in this case, namely the relevant mirror surface.

Figure 2D:
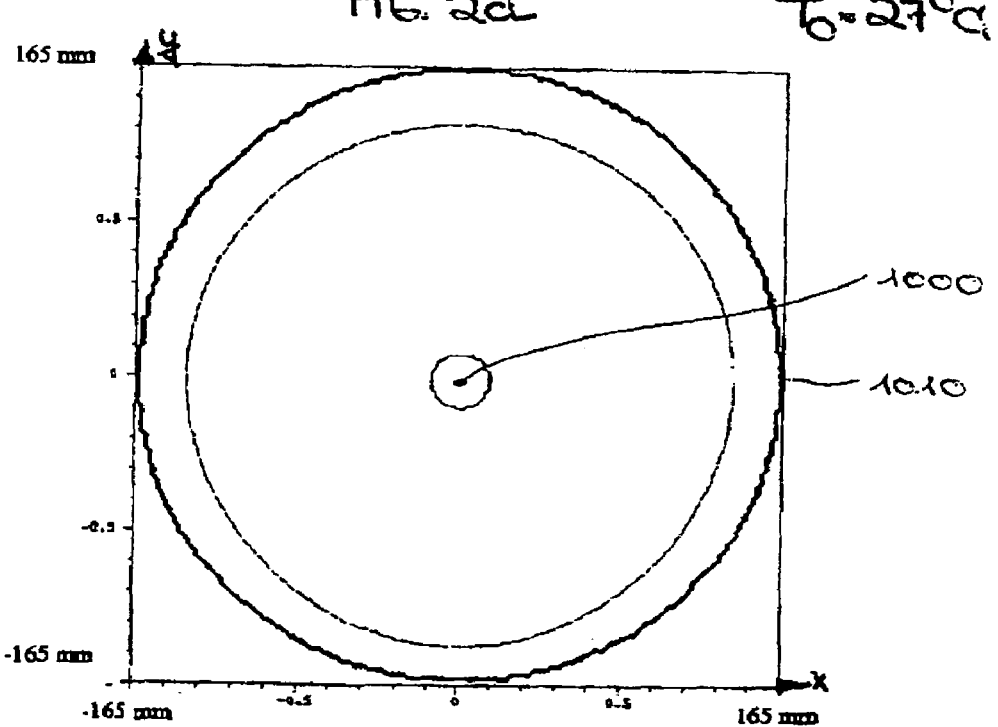

FIGS. 2c and 2d show deformations that occur as a result of the heating of the substrate surface of the second mirror of an EUV projection objective in accordance with U.S. Pat. No. 6,353,470 for example for materials with different zero crossing of the temperature-dependent coefficient of thermal expansion. The application of energy into the second mirror of a microlithography projection objective is generally lower than in the first mirror and is assumed to be 0.5 W over the entire optical surface of the substrate. If Ti-doped quartz glass is used as a basis for the substrate material, heating occurs to a maximum temperature $T_{max}=27.5°$ C. When using a substrate material with a zero crossing of the temperature-dependent coefficient of thermal expansion with $T_0=23°$ C., the PV value is 0.34 nm (FIG. 2c) and when using a substrate material with a zero crossing of the temperature-dependent coefficient of thermal expansion at $T_0 \approx T_{max}=27°$ C. the PV value is 0.11 nm (FIG. 2d). The substrate surface which forms the mirror surface is designated as the optical surface of the substrate. In the case that it carries a coating, it is the surface on which the electromagnetic radiation (e.g. the EUV radiation) impinges and is reflected. The optical surface of the substrate therefore corresponds in its geometrical shape to the mirror surface.

As is shown in the FIGS. 2a and 2b, the first mirror is an ellipsoid mirror. The long axis of the ellipse has an extension of 160 mm and the short axis of the ellipse has an extension of 120 mm. The second mirror according to FIGS. 2c and 2d is a circular mirror with a radius of 165 mm.

FIG. 3 shows an EUV projection objective as known from U.S. Pat. No. 6,353,470. The EUV projection objective comprises a first mirror S1, a second mirror S2, a third mirror S3, a fourth mirror S4, a fifth mirror S5, and a sixth mirror S6. An object in an object plane 2 is projected by the projection objective into a reduced image in an image plane 4. A diaphragm B of the projection objective is formed on the second mirror S2. The system is centered around an optical axis HA and has an intermediate image Z in a light path from the fourth mirror S4 to the fifth mirror S5.

The mirrors S1, S2, S3, S4, S5 and S6 are arranged as normal-incidence mirrors with a substrate material and a multiple layer system made of Mo/Si alternating layers on the substrate material. The substrate material of at least one or several mirrors S1, S2, S3, S4, S5, S6 has a temperature-dependent coefficient of thermal expansion $\alpha(T)$ having a zero crossing at a temperature $T_0$ that corresponds approximately to $T_{max}$.

Setting the zero crossing of the temperature-dependent coefficient of thermal expansion to the maximum temperature that occurs as a result of the heating of the optical component in the substrate material can also be transferred to a coating of the substrate material. Thus, the coating material should have a zero crossing set to the maximum temperature. The coating material in such a case must have (i) a temperature-dependent coefficient of thermal expansion $\alpha(T)$, or (ii) a derivative of $\alpha(T)$ with respect to temperature, i.e., $d\alpha(T)/dT$, having a zero crossing or a change of sign at a temperature $T_0$ that lies in a temperature range that is achieved maximally by the heating of the optical component.

FIG. 4 shows an EUV projection exposure system, comprising a light source 100, an illumination system 101 for illuminating a field in a plane 102 in which a structure-bearing mask is arranged, and a projection objective 104 comprising six mirrors for image-forming the structure-bearing mask in the plane 102 to a light-sensitive substrate in a plane 106. Reference is hereby made to EP-A-1 123 195 concerning the EUV illumination system, whose scope of disclosure is fully included in the present application. Reference is hereby made to U.S. Pat. No. 6,353,470 concerning the six-mirror objective.

Each of the optical components of the EUV projection exposure system, i.e., the optical components of the illumination system and the mirrors of the projection objective or even the reticle or the reflection mask, can be configured of a substrate material or also a coating whose temperature-dependent coefficient of thermal expansion $\alpha(T)$ or its derivative with respect to temperature $d\alpha(T)/dT$ has a zero crossing or a change in sign at a temperature $T_0$, with the materials being chosen in such a way that the zero crossing of the temperature-dependent coefficient of thermal expansion $\alpha(T)$ or its derivation according to $d\alpha(T)/dT$ is chosen in such a way that the temperature $T_0$ corresponds to the maximum temperature $T_{max}$ which occurs in the respective component as a result of heating.

The present disclosure provides for optical components, and especially mirrors for EUV projection objectives, having minimal aberrations through a respective choice of material.

What is claimed is:

1. An optical component, comprising:
   a material having a surface that, when subjected to radiation, heats to a maximum temperature ($T_{max}$) and has a temperature variation ($\delta T$) thereon,
   wherein said material has a temperature-dependent coefficient of thermal expansion ($\alpha(T)$) of about zero at a temperature $T_0$, and
   wherein $T_{max} - 0.5 \cdot \delta T \leq T_0 \leq T_{max} + 0.5 \cdot \delta T$.

2. The optical component of claim 1, wherein $\alpha(T)$ has an approximately linear temperature dependence $\alpha(T)=m(T-T_0)$ in a temperature region close to $T_0$, where m is a gradient of $\alpha(T)$.

3. The optical component of claim 2, where $|m|<1 \cdot 10^{-6} K^{-2}$.

4. The optical component of claim 1, wherein said material is selected from the group consisting of glass ceramic and Ti-doped quartz glass.

5. The optical component of claim 1, wherein said material comprises a substrate material.

6. The optical component of claim 5, further comprising a coating applied to said substrate material.

7. The optical component of claim 5, wherein said substrate material is selected from the group consisting of glass ceramic and Ti-doped quartz glass.

8. The optical component of claim 5, wherein the optical component is a mirror comprising a coating applied to said substrate material.

9. The optical component of claim 8, wherein said coating comprises a material selected from the group consisting of ruthenium, palladium and rhodium layer.

10. The optical component of claim 8, wherein said coating comprises a pair of layers in a configuration of materials selected from the group consisting of Mo/Si, Mo/Be and MoRu/Be.

11. The optical component of claim 1, wherein the optical component is a reticle mask for extreme ultraviolet (EUV) lithography.

12. The optical component of claim 1, wherein said radiation includes a wavelength $(\lambda) \leq 193$ nm.

13. The optical component of claim 1, wherein the optical component is a reticle mask for extreme ultraviolet (EUV) lithography.

14. An optical component, comprising:
    a material having a surface that, when subjected to radiation, heats to a maximum temperature ($T_{max}$), and has a temperature variation thereon within a range of $T_{max} \pm 3K$,
    wherein said material has a temperature-dependent coefficient of thermal expansion ($\alpha(T)$) of about zero at a temperature $T_0$, and
    wherein $T_{max} - 3K \leq T_0 \leq T_{max} + 3K$.

15. The optical component of claim 14, wherein $\alpha(T)$ has an approximately linear temperature dependence $\alpha(T)=m(T-T_0)$ in a temperature region close to $T_0$, where m is a gradient of $\alpha(T)$.

16. The optical component of claim 15, where $|m|<1 \cdot 10^{-6} K^{-2}$.

17. The optical component of claim 14, wherein said material is selected from the group consisting of glass ceramic and Ti-doped quartz glass.

18. The optical component of claim 14, wherein said material comprises a substrate material.

19. The optical component of claim 18, further comprising a coating applied to said substrate material.

20. The optical component of claim 18, wherein said substrate material is selected from the group consisting of glass ceramic and Ti-doped quartz glass.

21. The optical component of claim 18, wherein the optical component is a mirror comprising a coating applied to said substrate material.

22. The optical component of claim 21, wherein said coating comprises a material selected from the group consisting of ruthenium, palladium and rhodium layer.

23. The optical component of claim 21, wherein said coating comprises a pair of layers in a configuration of materials selected from the group consisting of Mo/Si, Mo/Be and MoRu/Be.

24. An illumination system for illuminating a field in a plane, said illumination system comprising:
    an optical component that includes a material having a surface that, when subjected to radiation of a wavelength $\leq 193$ nm, heats to a maximum temperature ($T_{max}$), and has a temperature variation ($\delta T$) thereon,
    wherein said material has a temperature-dependent coefficient of thermal expansion ($\alpha(T)$) of about zero at a temperature $T_0$, and
    wherein $T_{max} - 0.5 \cdot \delta T \leq T_0 \leq T_{max} + 0.5 \cdot \delta T$.

25. A projection objective for projecting an object into an object plane, said projection objective comprising:
    an optical component that includes a material having a surface that, when subjected to radiation of a wavelength $\leq 193$ nm, heats to a maximum temperature ($T_{max}$), and has a temperature variation ($\delta T$) thereon,
    wherein said material has a temperature-dependent coefficient of thermal expansion ($\alpha(T)$) of about zero at a temperature $T_0$, and
    wherein $T_{max} - 0.5 \cdot \delta T \leq T_0 \leq T_{max} + 0.5 \cdot \delta T$.

26. The projection objective of claim 25, wherein said optical component is a mirror.

27. A projection exposure system for microlithography, comprising:
    a carrier for holding a structure-bearing mask;
    a carrier for holding a light-sensitive substrate;
    a source of radiation;
    an illumination system that collects said radiation and forwards said radiation to illuminate said structure-bearing mask; and
    a projection objective that projects said structure-bearing mask onto said light-sensitive substrate;
    wherein at least one of said illumination system or said projection objective includes an optical component that includes a material having a surface that, when subjected to said radiation, heats to a maximum temperature ($T_{max}$), and has a temperature variation ($\delta T$) thereon,
    wherein said material has a temperature-dependent coefficient of thermal expansion ($\alpha(T)$) of about zero at a temperature $T_0$, and
    wherein $T_{max} - 0.5 \cdot \delta T \leq T_0 \leq T_{max} + 0.5 \cdot \delta T$.

28. A method for producing a microelectronic component, comprising employing the projection exposure system of claim 27.

* * * * *